United States Patent
Heiss et al.

(10) Patent No.: US 11,863,168 B2
(45) Date of Patent: Jan. 2, 2024

(54) PHASE CHANGE SWITCH DEVICE AND METHOD OF OPERATING A PHASE CHANGE SWITCH DEVICE

(71) Applicant: Infineon Technologies AG, Neubiberg (DE)

(72) Inventors: Dominik Heiss, Munich (DE); Christoph Kadow, Gauting (DE); Hans Taddiken, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/870,934

(22) Filed: Jul. 22, 2022

(65) Prior Publication Data

US 2023/0021991 A1    Jan. 26, 2023

(30) Foreign Application Priority Data

Jul. 26, 2021   (EP) .................................... 21187790

(51) Int. Cl.
*H03K 17/56*   (2006.01)

(52) U.S. Cl.
CPC .................................. *H03K 17/56* (2013.01)

(58) Field of Classification Search
CPC .. G01R 27/08; H10N 70/861; H10N 70/8613; H10N 70/231; H10N 70/826
See application file for complete search history.

(56) References Cited

U.S. PATENT DOCUMENTS

| | | | |
|---|---|---|---|
| 8,183,551 B2 * | 5/2012 | Kordus, II | G11C 13/0004 257/E45.002 |
| 2014/0266300 A1 * | 9/2014 | Sherwin | H10N 70/231 326/38 |
| 2016/0079019 A1 * | 3/2016 | Borodulin | H10N 70/253 337/396 |
| 2018/0005786 A1 | 1/2018 | Navarro et al. | |
| 2020/0058354 A1 | 2/2020 | Slovin et al. | |
| 2020/0058850 A1 | 2/2020 | El-Hinnawy et al. | |
| 2022/0404406 A1 * | 12/2022 | Adamski | G01R 27/08 |
| 2022/0406997 A1 * | 12/2022 | Adamski | H10N 70/8613 |

* cited by examiner

*Primary Examiner* — Quan Tra
(74) *Attorney, Agent, or Firm* — Murphy, Bilak & Homiller, PLLC (57) ABSTRACT

In an embodiment, a phase change switch device is provided. The phase change switch includes a phase change material, a set of heaters arranged to heat the phase change material and a power source. A switch arrangement including a plurality of switches is provided, which is configured to selectively provide electrical power from the power source to the set of the heaters.

16 Claims, 7 Drawing Sheets

PHASE CHANGE SWITCH DEVICE AND METHOD OF OPERATING A PHASE CHANGE SWITCH DEVICE

TECHNICAL FIELD

The present application relates to phase change switch devices and to methods of operating phase change switch devices.

BACKGROUND

The technical requirements for radio frequency (RF) applications using high frequencies, such as radar sensing and mobile communication according to the 5G standard, are increasing. In particular, switches having improved characteristics compared to state-of-the-art CMOS switches will be required to meet future demands. Phase change switches are considered as promising candidates for switching RF signals. Such phase change switches use a phase change material (PCM) which typically exhibits a higher electric conductivity in a crystalline phase state than in an amorphous phase state. By changing the phase state of the phase change material, a switch device including such a material may be switched on and off.

For example, to change the phase state from amorphous to crystalline, typically a heater is employed heating the phase change material causing crystallization. This switching on by causing crystallization is also referred to as a set operation. In the set operation, the heater is actuated in such a way that the temperature of the phase change material is above its crystallization temperature, typically about 250° C., but below the melt temperature typically in a range of 600° C. to 900° C., for example. The length of the heating pulse caused by the heater is chosen such that any amorphous region present in the PCM can regrow into the crystalline phase state.

When switching off the switching device, also referred to as reset operation, the heater is actuated in such a way that the temperature of the PCM is raised above the melt temperature (for example above about 600° C. to 900° C.) followed by a comparatively rapid cooldown which freezes the phase change material into an amorphous state.

Suitable phase change materials used for such phase change switches include germanium telluride (GeTe) or germanium-antimony-tellurium (GeSbTe, usually referred to as GST), and heaters may be made of a material like polycrystalline silicon or tungsten.

In order to meet demands regarding currents to be switched, voltages to be switched and/or on resistances to be achieved, sometimes several phase change switches are coupled in series and/or coupled in parallel. This means that for a set or reset operation, sometimes all individual phase change switches of such a switch device need to be switched. In particular for the reset where a high temperature is required, this means that a corresponding power source has to provide the switch device with a high power. Moreover, issues related to electromigration may occur in phase change switches limiting the lifetime of a phase change switch.

SUMMARY

A phase change switch device and a method of operating such a phase change switch device are provided.

According to an embodiment, a phase change switch device is provided, comprising: a phase change material, a set of heaters arranged to heat the phase change material, a power source, and a switch arrangement including a plurality of switches and configured to selectively provide electrical power from the power source to the set of heaters.

In another embodiment, a method of operating such a phase change switch device is provided, comprising:
operating the plurality of switches of the switch arrangement for at least one of:
selectively providing a current either in a first direction through at least one heater of the set of heaters or in a second direction through the at least one heater of the set of heaters, or
forming a pulse of electrical power through at least one heater of the set of heaters.

According to another embodiment, a method of operating the phase change switch device as defined above is provided, wherein the set of heaters comprises a plurality of heaters, and wherein the method comprises:
operating the plurality of switches of the switch arrangement for at least one of:
supplying the plurality of heaters sequentially with electrical power from the power source,
selectively supplying the plurality of heaters sequentially or simultaneously with electrical power from the power source.

The above summary is merely intended as a brief overview over some embodiments and is not to be construed as limiting in any way, as other embodiments may include different features from the ones listed above.

DETAILED DESCRIPTION

In the following, various embodiments will be described in detail referring to the attached drawings. The embodiments described hereinafter are to be taken as examples only and are not to be construed as limiting. For example, while in embodiments specific arrangements or components are provided, in other embodiments other configurations may be used.

Besides features (or for example components, elements, acts, events or the like) explicitly shown and described, in other embodiments additional features may be provided, for example features used in conventional switch devices using phase change materials. For example, embodiments described herein relate to a switch arrangement for supplying power to one or more heaters and operation of the switch arrangement, and other components and features, like spatial arrangement of heaters and phase change material, radio frequency (RF) circuitry using the switch device and the like may be implemented in a conventional manner. Such RF circuitry may be integrated with the described switch devices on the same substrate, but may also be provided separately for example, on one or more separate chip dies, which in some implementations then may be combined with a switch device in a common package. Also, manufacturing implementations like providing phase change material on a substrate like a silicon substrate to implement a phase change switch, providing phase change material in a trench in a silicon substrate for manufacturing the switch device and the like may be performed in any conventional manner.

A switch based on a phase change material (PCM) will be referred to as a phase change switch or short PCM switch herein. As explained in the introductory portion, such phase change switches may be set to a crystalline phase state or an amorphous phase change, thus changing the resistance of the phase change material and therefore of the switch by several orders of magnitude. In this way, for example an on resistance of a switch in a range of 1 to 100 Ω may be achieved, whereas an off-resistance may be several orders of magnitude higher, for example at least in the Kiloohm range.

Implementation details described with respect to one of the embodiments are also applicable to other embodiments.

Embodiments discussed herein include switch arrangements. A switch arrangement generally includes a plurality of switches. Switches may be switched on to be electrically conducting between terminals with a low resistance, or switched off to essentially provide an electrical isolation between terminals. Such switches may be implemented at using for example one or more transistors like bipolar junction transistors, field-effect transistors or insulated gate bipolar transistors in any conventional manner.

A set, as used herein, refers to one or more entities. For example, a set of heaters refers to one or more heaters. In other words, in some embodiments a set may include only a single entity, for example a single heater.

Figure 1:
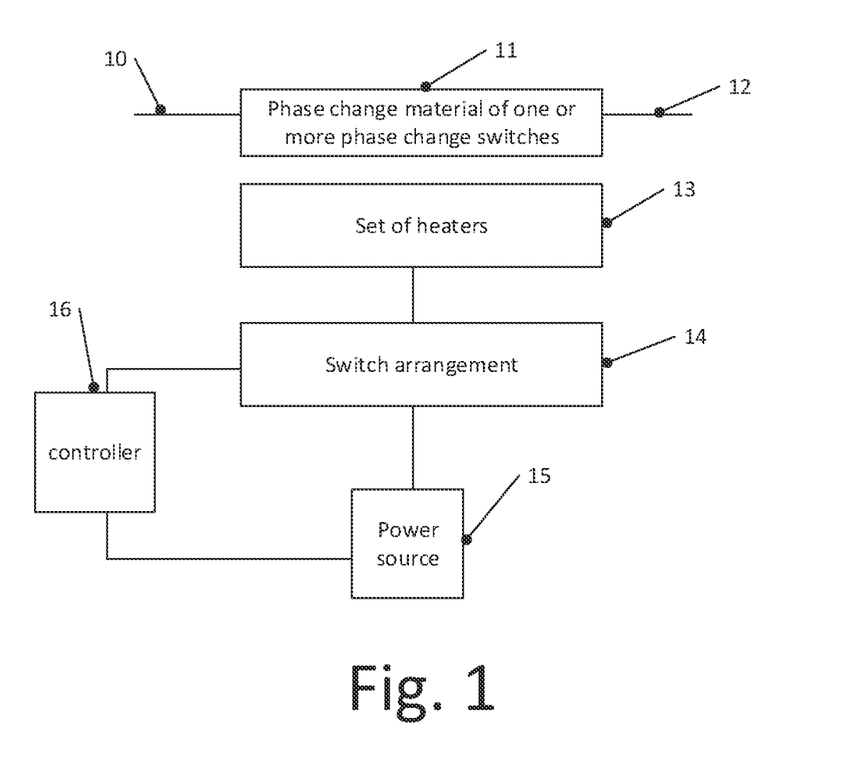
FIG. 1 is a block diagram of a switch device according to an embodiment.

Turning now to the Figures, FIG. 1 is a block diagram illustrating a switch device according to an embodiment. The switch device of FIG. 1 includes one or more phase change switches, which may be coupled in series or in parallel. Examples will be explained further below. These phase change switches include phase change material 11, which depending on its phase state (crystalline or amorphous, see above explanations) provides either a low electrical resistance between terminals 10 and 12 or a high electrical resistance between terminals 10 and 12. A set of heaters 13 is arranged to heat phase change material 11 to perform a set or reset operation, or in other words to switch one or more phase change switches on or off, as explained above. The set of heaters 13 is supplied with power from a power source 15 via a switch arrangement 14. Power source 15 in some embodiments may be a pulsed power source configured to generate pulses of electrical power.

Switch arrangement 14 includes a plurality of switches that may be controlled to provide power from power source 15 to the set of heaters 13 selectively, i.e. in various manners. Power source 15 and switch arrangement 14 are controlled by a controller 16. Controller 16 may for example be a microcontroller, an application-specific circuit, a programmed microprocessor and the like which is configured to control switch arrangement 14 and power source 15 accordingly.

Figure 2:
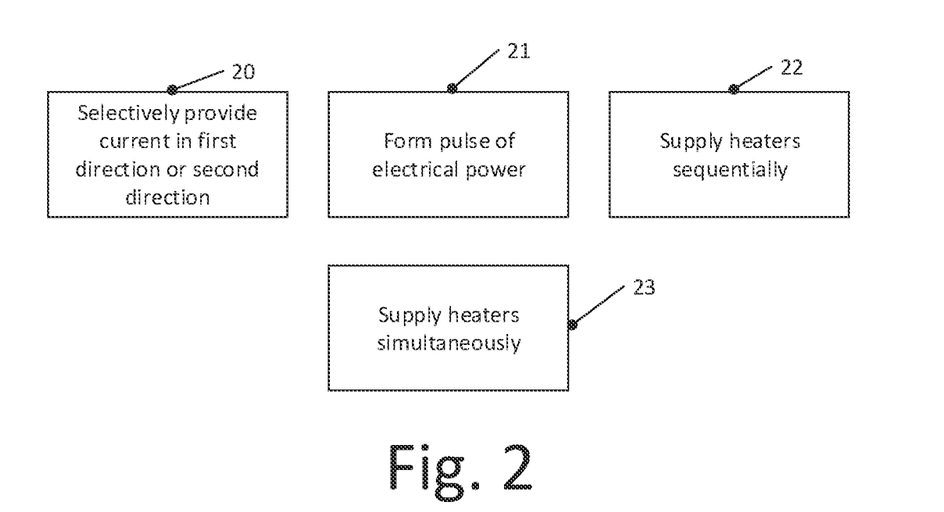
FIG. 2 is a diagram illustrating a method according to an embodiment.

Controlling switch arrangement 14 of FIG. 1 to selectively provide power to the set of heaters 13 from power source 15 will be further illustrated referring to FIG. 2, which illustrates a method according to some embodiments. The method of FIG. 2 may for example be implemented in the switch device of FIG. 1, for example by configuring controller 16 accordingly to control switch arrangement 14. The method of FIG. 2 may be also implemented using other switch devices like switch devices explained further below.

At 20 to 23, FIG. 2 shows various ways a switch arrangement like switch arrangement 14 may be controlled. The various possibilities at 20 to 23 may be implemented separately in different embodiments, but two or more of these possibilities may also be combined in a single embodiment.

At 20, the switch arrangement may be controlled to selectively provide current through one or more heaters of the set of heaters in a first direction or in the second direction opposite the first direction. Using different directions of current flow through the heaters in some embodiments may mitigate electromigration issues.

At 21, the switch arrangement is controlled to form a pulse of electrical power. While in some embodiments power source 15 or another power source used itself may be a pulsed power source, in other embodiments the switches of switch arrangement 14 may be opened and closed to form a pulse of power. In this case, a power source used like power source 15 may be a continuous power source.

At 22 and 23, the set of heaters includes a plurality of heaters. At 22, heaters are supplied with power sequentially, i.e. not all heaters receive power at the same time, but receive power sequentially one after the other, or one subset after the other. Therefore, "supplying heaters sequentially" also includes the possibility of supplying subsets sequentially, for example in case of four heaters first supplying the first and second heater with power and then supplying the third and fourth heater with power. "Sequentially" as used herein may mean "non-overlapping sequentially", i.e. only after one heater or subset of heaters has received power, a next heater or next subset received power, possible with a pause time therebetween. In some embodiments, this sequentially supplying heaters with power may be performed during a reset pulse, where generally higher temperatures of the phase change material and therefore higher power to the heaters are provided.

At 23, heaters are supplied with power simultaneously, for example by coupling heaters of the set of heaters in series or in parallel to receive power from power source 15. In some embodiments, the sequentially supplying at 22 and the simultaneously supplying at 23 may be performed selectively, such that for example the sequentially supplying at 22 is performed for a reset operation, whereas the simultaneously supplying at 23 is performed for a set operation.

More specific examples for the various possibilities explained for FIG. 2 will now be explained with reference to FIGS. 3 to 13.

In FIGS. 3 to 13, like, similar or functionally corresponding elements are designated with the same reference numerals and will not be described repeatedly in detail to avoid repetitions.

Figure 3:
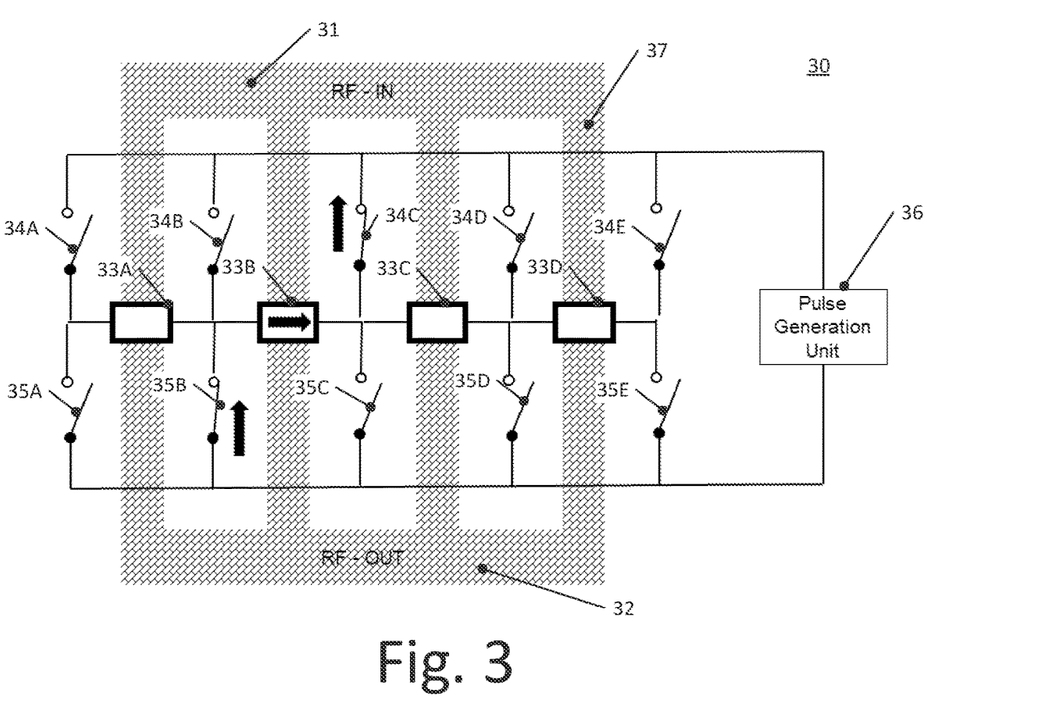
FIG. 3 is a circuit diagram of a switch device according to an embodiment.

FIG. 3 is a circuit diagram illustrating a switch device 30 according to an embodiment. Switch device 30 shows a single pole single throw (SPST) configuration to selectively couple an input 31 with an output 32. Input 31 in operation may receive a radio frequency input signal RF-IN, and output 32 may, when switch device 30 is on, output an output signal RF-OUT. Reference numeral 37 generally designates conductive material, for example a structured metal layer.

In the example of switch device 30, four phase change switches are coupled in parallel between input 31 and output 32. Each phase change switch has a heater 33A, 33B, 33C, 33D, respectively, collectively referred to as heaters 33, and corresponding a phase change material (not explicitly shown in FIG. 3 for clarity's sake, see phase change material 11 of FIG. 1) adjacent to the heater and coupled to conductive material 37. By setting or resetting the phase state of the respective phase change material by operating heaters 33, a low resistance between input 31 and output 32 (switched on state, set state of the phase change material) or a high electrical resistance (switched off state, reset state of the phase change material) may be achieved.

For performing set or reset operations, heaters 33 are supplied with power from a pulse generation unit 36, which is an example for a power source. Pulse generation unit 36 generates pulses of electrical power controlled by a controller (not shown in FIG. 3, but see controller 16 of FIG. 1).

A first terminal of pulse generation unit 36 (for example first pole) is coupled to terminals of heaters 33 via first switches 34A to 34E, collectively referred to as first switches 34, and a second terminal (for example second pole) of pulse generation unit 36 is coupled to terminals of heaters 33 via second switches 35A to 35E, collectively referred to as second switches 35. First switches 34 and second switches 35 together form an example of a switch arrangement like switch arrangement 14 of FIG. 1 and may be used to selectively provide heaters 33 with power.

For example, for supplying heaters sequentially with power as at 22 in FIG. 2, one of the first switches 34 and one of the second switches 35 may be closed to supply an individual heater with power. This is illustratively shown in FIG. 3 for heater 33B, where first switch 34C and second switch 35B are closed to provide a current flow through heater 33B as indicated via arrows. To supply all four heaters at 33A to 33D with power sequentially, then for example first switches 34B and 35A are closed to supply heater 33A with power, then switches 34C and 35B are closed as shown, then switches 34B and 35C are closed to supply heater 33C with power, and finally switches 34E and 35D are closed to supply heater 33D with power. It should be noted that the heaters do not need to be supplied with power in this order, and other orders are also possible.

Conversely, to provide all heaters with power simultaneously, for example first switch 34E and second switch 35A may be closed, leading to a series connection of all heaters 33A to 33D. Also, subsets of heaters may be supplied with power in series. For example, by closing switches 34C, 35A, heaters 33A and 33B may be supplied with power.

Furthermore, the current flow may also be reversed. For example, for a reverse current flow through heater 33B, instead of switches 34C and 35B, switches 34B and 35C may be closed.

Finally, in some embodiments pulses may be formed using first switches 34 and second switches 35, by closing at least one of the switches (in the example shown switch 34C or 35B) only for a required pulse duration, while a power source instead of pulse generation unit 36 provides power continuously.

Figure 4A:
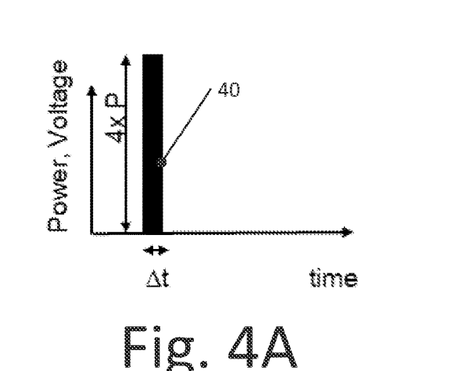
FIGS. 4A to 4C are diagrams illustrating supplying power to heaters of a switch device.
Figure 4B:
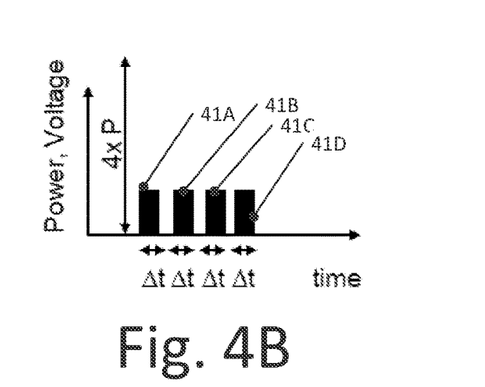
Figure 4C:
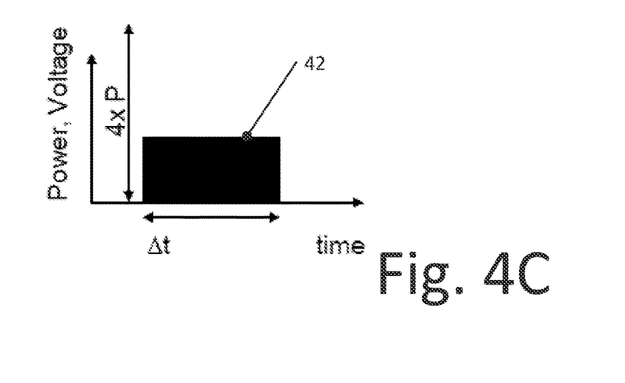

The concept of applying power sequentially or simultaneously will be further illustrated referring to FIGS. 4A to 4C.

FIG. 4A shows power and voltage over time for using a single pulse 40 as a reset pulse (i.e. causing a change from a crystalline phase state to an amorphous phase state) in a case where all heaters, for example heaters 33A to 33D, are coupled in series (switches 35A and 34E closed, or switches 34A and 35E closed). Here, a comparatively high power and voltage is required to rapidly heat the phase change material above its melting point in all four phase change switches. Because of the series connection, the voltage drop over each heater is approximately one fourth of the applied voltage.

FIG. 4B shows a case according to an embodiment where four heaters like heaters 33A to 33D are supplied with power sequentially.

In FIG. 4B, four pulses 41A to 41D are applied, one to each heater (i.e. for example as explained above first switches 35A and 34B are closed, then switches 35B and 34C are closed etc.). In this case, to achieve the same voltage drop as in FIG. 4A for each heater, the applied voltage only needs to be approximately divided by a factor of four compared to FIG. 4A (i.e. the voltage in FIG. 4B is one fourth of the voltage in FIG. 4A) and assuming the same current, this means that the applied power is also only one fourth. This may facilitate design of the power source, as it need not be designed for a higher voltages and powers, and may also affect the dimensioning of electrical connections, switches etc. On the other hand, the overall time for resetting all four phase change switches is longer also approximately by a factor of four. As for reset pulses the time duration Δt, however, generally is comparatively short, this is acceptable for many applications.

FIG. 4C shows an example for a set pulse 42 in a case where all heaters are coupled in series (as in FIG. 4A). Generally, for a set pulse lower powers are required (heating to lower temperatures) over a longer time in order to effect recrystallization of the phase change material. As here generally lower powers are required, in embodiments the heaters are coupled in series and therefore supplied with power simultaneously, whereas for a reset pulse as shown in FIG. 4B the heaters are supplied with power sequentially.

FIG. 3 shows a single pole single throw configuration with a single input 31 and a single output 32. Four parallel branches with respective heaters are used. This is merely an example, and other configurations may be used as well. For example, in FIG. 3 more than four parallel branches or less than four parallel branches may be used. Moreover, other configurations than single pole single throw may be used. Some examples for such other configurations will be described next with reference to FIGS. 5 to 8.

Figure 5:
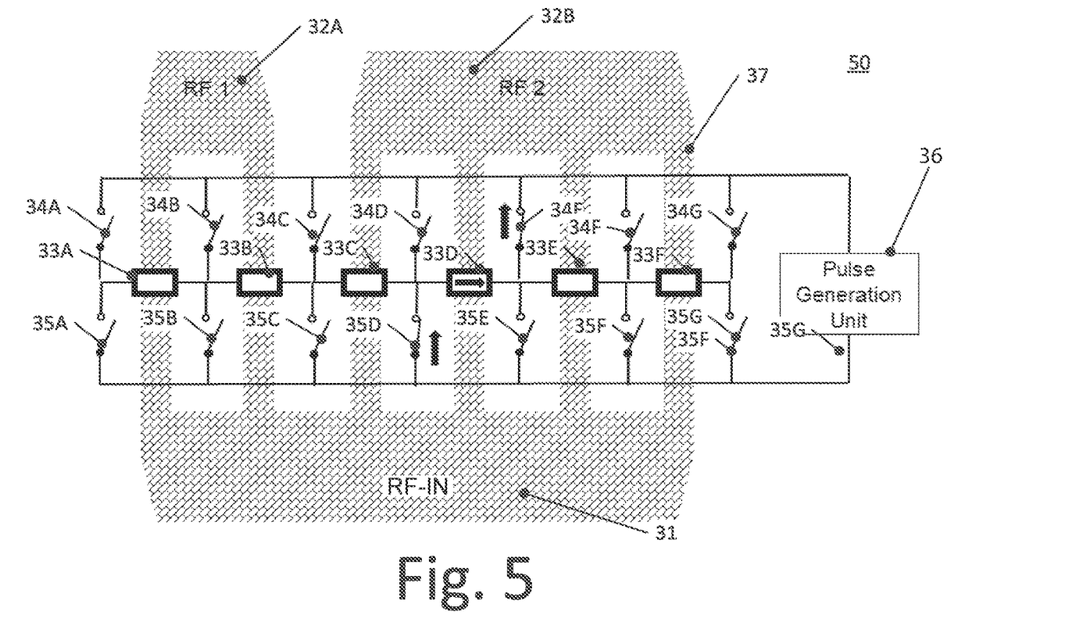
FIGS. 5 to 10 show circuit diagrams of switch devices according to various embodiments.

FIG. 5 illustrates a switch device 50 with an asymmetric single pole double throw (SPDT) configuration with six PCM switches. An input 31 may be selectively coupled to a first output 32A to output a signal RF1, a second output 32B to output a signal RF2 or both. A path from input 31 to first output 32A has two parallel branches with heaters 33A, 33B and a corresponding phase change material (again not shown), and a path from input 31 to second output 32B has four parallel branches with heaters 33C to 33F (and corresponding phase change material). First switches 34A to 34G and second switches 35A to 35D are provided. Using the switches, similar to what was explained with reference to FIG. 3, heaters 33 may be selectively supplied with power from pulse generation unit 36, for example sequentially, simultaneously and in different directions. For example, in FIG. 5 first switch 34B and second switch 35D are shown as closed, such that current flows through heater 33D as indicated by arrows.

Figure 6:
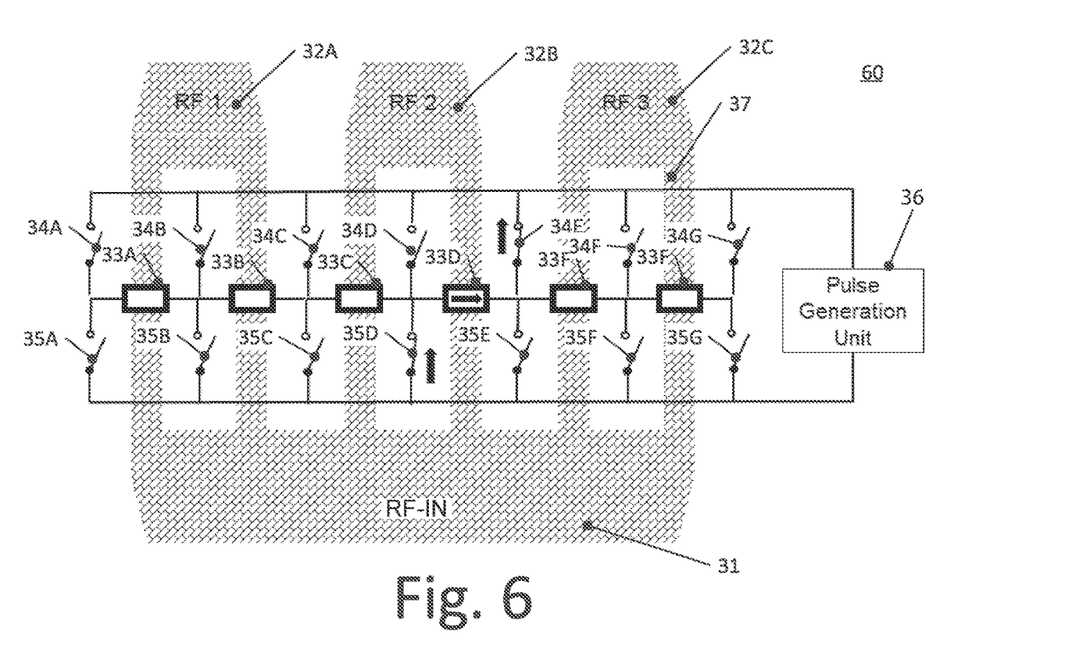

FIG. 6 shows a symmetric single pole triple throw (SP3T) configuration of a switch device 60, with input 31, a first output 32A for outputting a signal RF1, a second output 32B for outputting a signal RF2 and a third output 32C for outputting a signal RF3. Two parallel branches are provided to each of outputs 32A, 32B, 32C, with two respective heaters 33A to 33F provided to each branch. First switches 34A to 34G and 35A to 35G are provided to selectively provide power to the heaters, as explained above. In the example shown, switches 34E and 35D are closed to provide a current flow through heater 33D as indicated by arrows.

Figure 7:
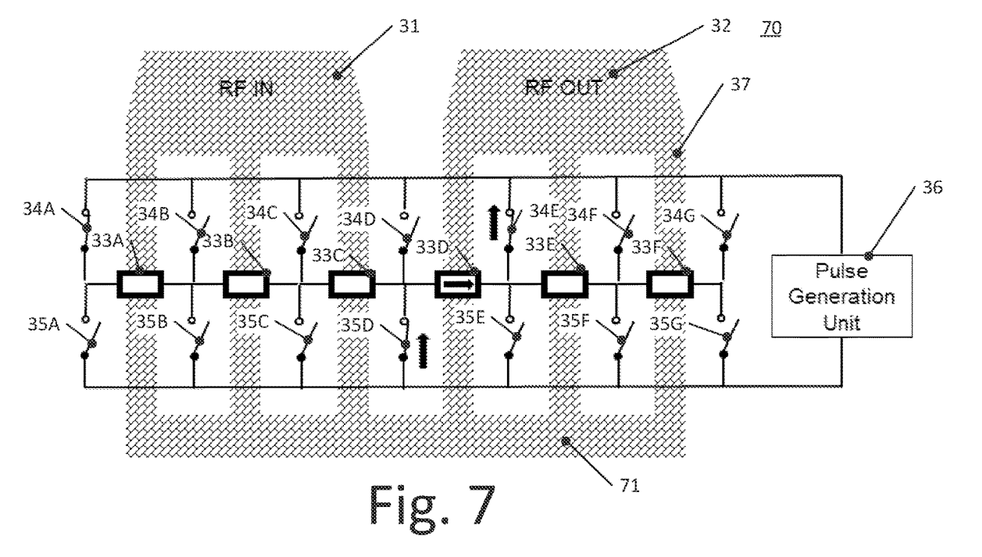

FIG. 7 shows a single pole single throw configuration of a switch devices 70 with input 31 and output 32. The configuration of FIG. 7 has three branches in parallel from input 31 to an intermediate conducting area 71 and another three branches from intermediate conducting area 71 to output 32. Each of the branches has a respective heater 33A to 33F with corresponding phase change material. First switches 34A to 34F and second switches 35A to 35F are used to selectively supply power. For example, in FIG. 7 power is supplied to heater 33D by closing switches 34D, 35C.

A configuration with the intermediate conducting area 71 as shown in FIG. 7 may also be referred to as a double stacked configuration.

Figure 8:
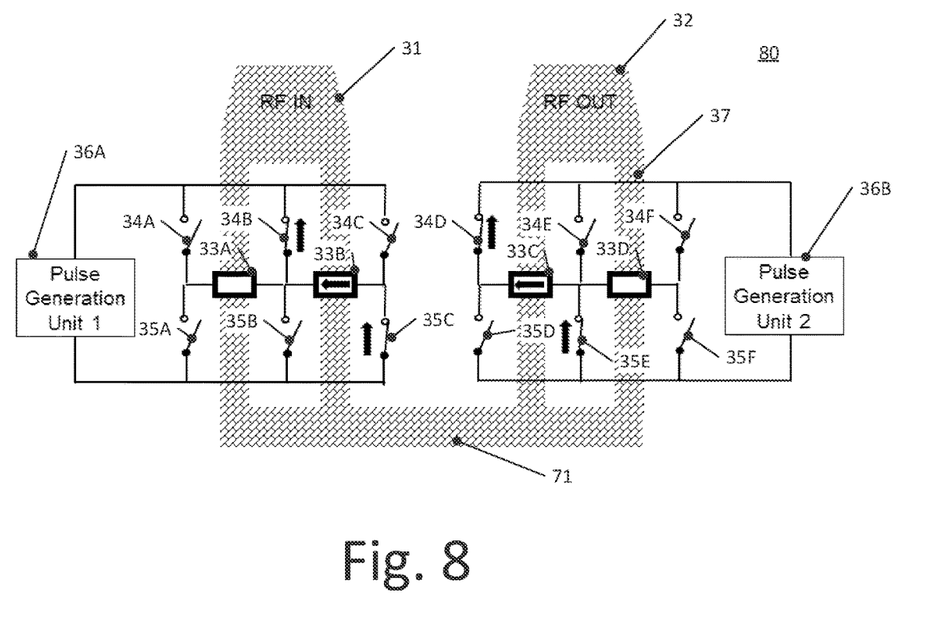

FIG. 8 shows another double stacked configuration of a single pole single throw switch device 80 with two paths from an output 31 to intermediate conducting area 71 and another two paths from intermediate conducting area 71 to output 32. In this case, the switch arrangements and pulse generating units are separate for the path from input 31 to intermediate conducting area 71 on the one hand and the path from intermediate conducting area 71 to output 32 on the other hand, i.e. a first pulse generating unit 36A and a second pulse generating unit 36B are provided. Via switches 34A to 34C and 35A to 35C, first and second heaters 33A, 33B may selectively be supplied with power from first pulse generating unit 36A, and via switches 34D to 34F and 35D to 35F, power may selectively be provided from second pulse generating unit 36B to heaters 33C, 33D. In the example shown, by closing switches 34B and 35C current flows through heater 33B, and by closing switches 34D and 35D, current flows through heater 33C, as indicated by respective arrows.

Features from the embodiments of FIGS. 3 and 5-8 may also be combined. For example, a double stacked configuration with intermediate conducting area 71 may also be provided for SPDT or SP3T configurations. Generally, as can be seen from FIGS. 3 and 5 to 8, different numbers of parallel path, stacked configurations like double stacked configurations, different numbers of outputs may be used, e.g. generally single pole multi throw configurations. In other embodiments, also the number of inputs may vary, and two or more inputs may be provided. Furthermore, the specific numbers of parallel paths, inputs and outputs shown is not to be construed as limiting, but merely as examples, and more or less inputs/outputs as shown or more or less parallel paths as shown may also be used.

In the embodiments discussed with reference to FIGS. 3 and 5 to 8, each heater is surrounded by a "H-configuration" of switches, for example heater 33A in each of these embodiments by switches 34A, 34B, 35A, 35B. In this way, each terminal of the respective heater may be coupled with each terminal of the respective power source, for example pulse generating unit, which gives a high flexibility. In other embodiments, some switches may be omitted. This may reduce flexibilities in some embodiments regarding current flow, but may lead to reduced manufacturing costs as less switches are needed.

Figure 9:
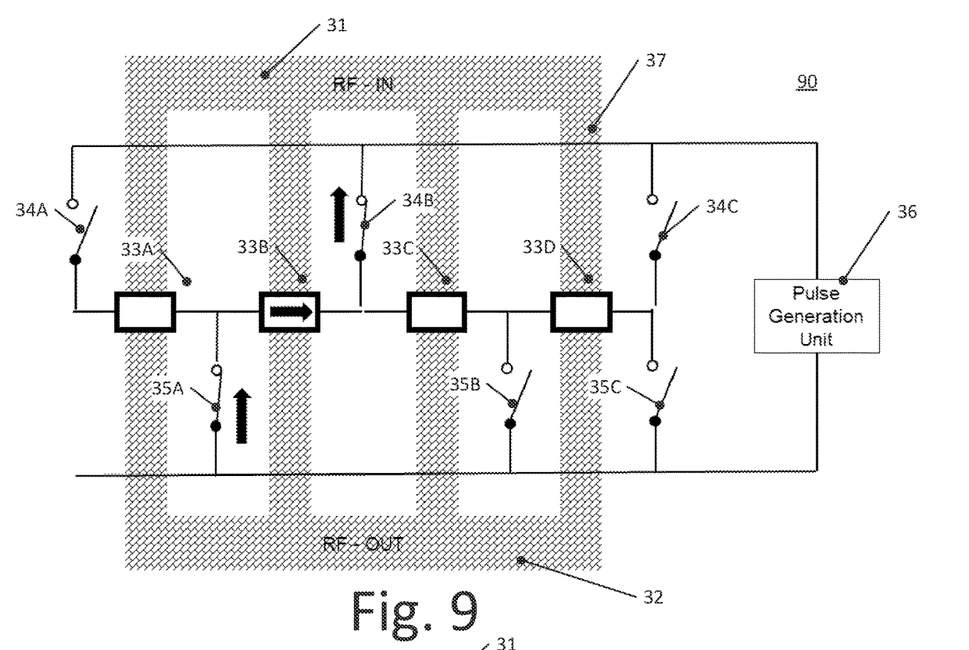
Figure 10:
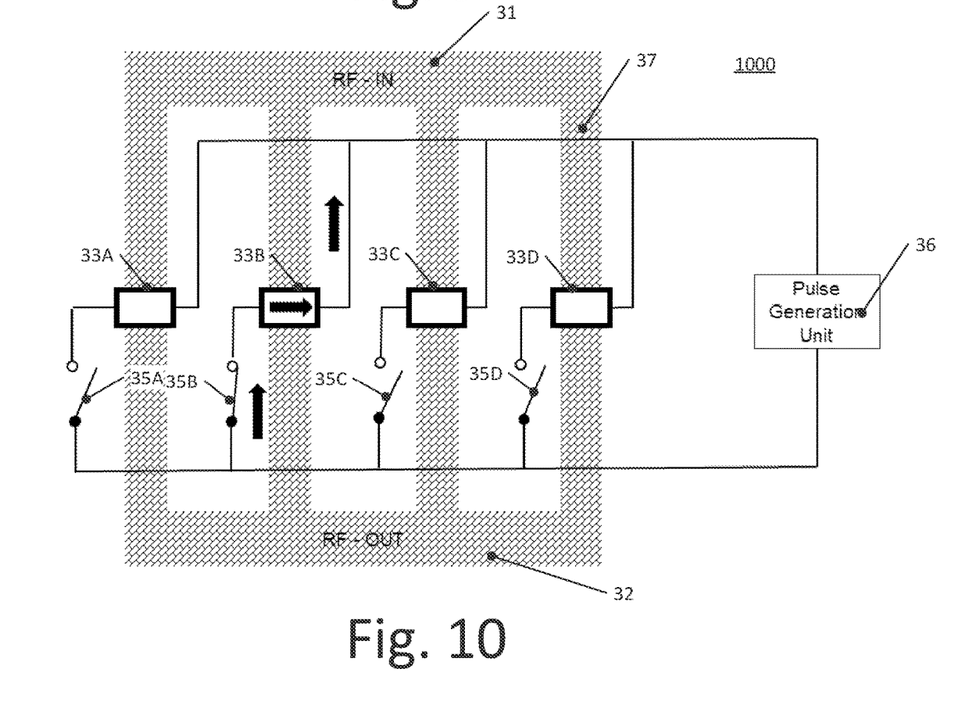

FIGS. 9 and 10 show corresponding examples. FIGS. 9 and 10 are modifications of the embodiment of FIG. 3 and each show a single pole single throw switch device with four parallel branches and associated heaters 33A to 33D. The variations shown in FIGS. 9 and 10 regarding the number of switches are also applicable to the other embodiments. For example, also the embodiments of FIGS. 5 to 8 may be implemented with a reduced number of switches.

In a switch device 90 of FIG. 9, first switches 34A, 34B and 34C and second switches 35A, 35B and 35C are provided as shown. With this arrangement, power may be provided either sequentially to heaters 33A to 33D or simultaneously. For providing power to heater 33A, switches 34A and 35A are closed, for providing power to heater 33B as shown, switches 35A and 34B are closed leading to a current flow as indicated by arrows, for providing power to heater 33C switches 34B and 35B are closed, and for providing power to heater 33D switches at 35B and 34C are closed. Unlike for example FIG. 3, for each heater only one direction of current flow is possible. For providing power to all heaters simultaneously, switches 34A and 35C are closed such that current flows through the series connection of heaters 33A to 33D.

FIG. 10 shows a switch device 1000 according to another embodiment. Here, only second switches 35A to 305D are provided. In this configuration, heaters may be supplied with power sequentially, by closing switches 35A to 35B sequentially. In the example of FIG. 10, switch 35D is closed, thus providing power to heater 33B as illustrated by arrows. Alternatively, for example all switches 35A to 35D may be closed, thus providing a parallel circuit of heaters of 33A to 33D and enabling to provide power simultaneously (in this case through a parallel connection and not through series connection as in FIG. 9). Also here, the direction of the current flow for each heater cannot be changed by operating the switch arrangement.

Figure 11:
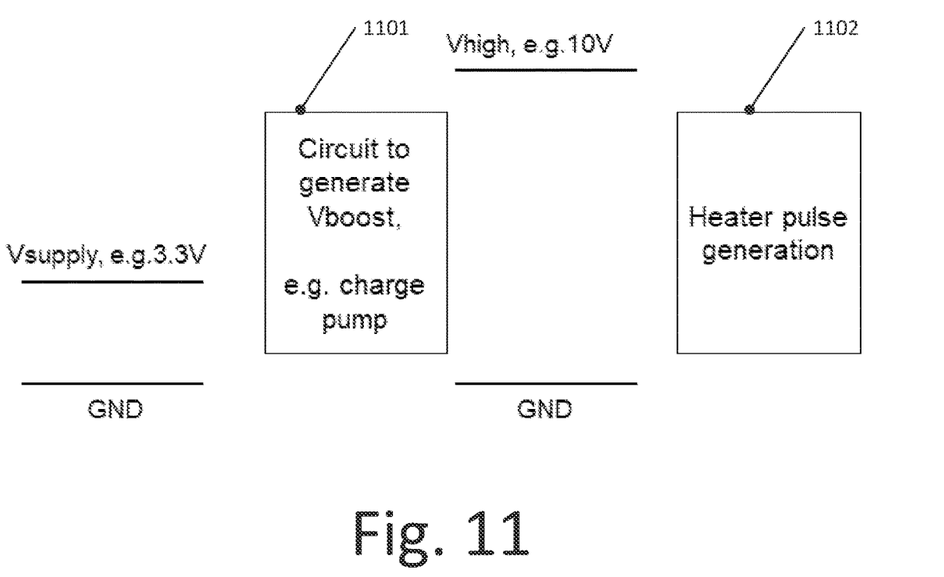
FIG. 11 illustrates voltages used in various embodiments.

Next, issues regarding electromigration and changing the direction of current flow will be explained referring to FIGS. 11 to 13.

In some embodiments, a higher voltage than a normal supply voltage is used to supply the heaters. Generally, for supplying the heaters, essentially the delivered power, i.e. product of voltage and current, is relevant. Providing a higher voltage (and reduce current) may be beneficial in terms of electromigration as lifetime of a heater limited by electromigration scales with the inverse square of the current, such that reducing the current reduces electromigration, which in turn may increase the lifetime of the heater. An example is shown in FIG. 11. Here, a device where the phase change switch is to be incorporated is supplied with a supply voltage of for example 3.3 volt. This is boosted to a higher voltage Vhigh by a circuit 1101, for example a charge pump. Vhigh may for example be 10 volt. This higher voltage of 10 volt is then used for heater pulse generation.

Electromigration is the transport of material caused by the gradual movement of atoms in a conductor due to the momentum transfer between conducting electrons and diffusing metal atoms. By balancing the current direction, i.e. not always using the same current direction for heating a heater, the effect of electromigration may be reduced. As already mentioned, this may be achieved by switch arrangements for example shown in FIG. 3. This is described now in more detail with reference to FIGS. 12A and 12B.

Figure 12A:
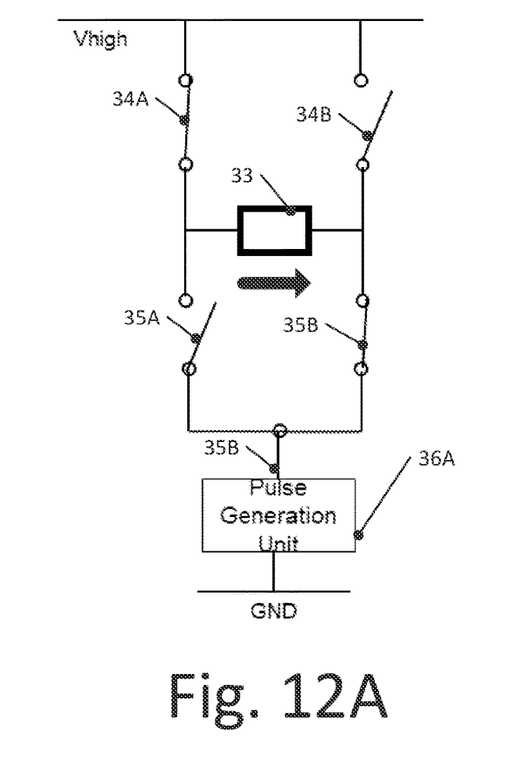
FIGS. 12A and 12B illustrate a switch device according to an embodiment in different operational states.
Figure 13:
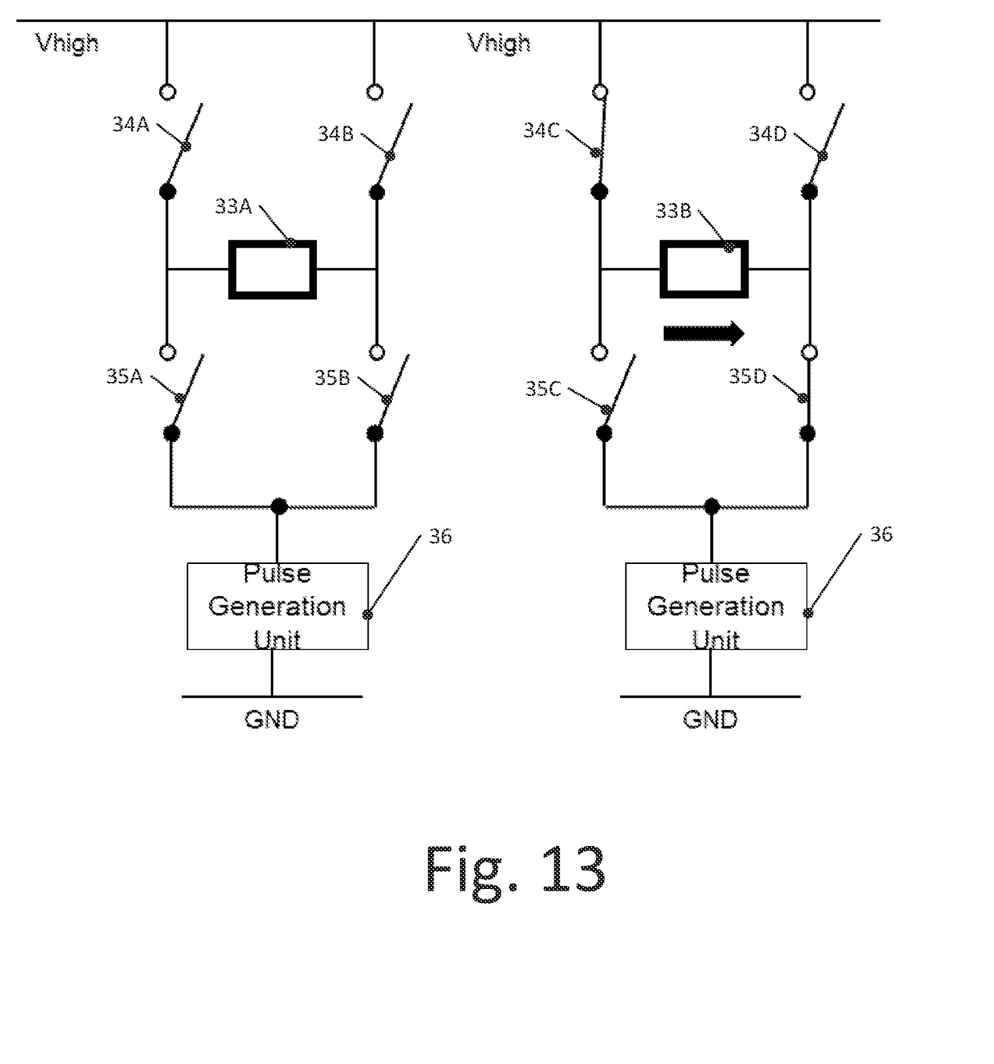
FIG. 13 illustrates a switch device according to an embodiment.

FIG. 12A shows a single heater 33 with first switches 34A, 34B and second switches 35A, 35B. The switches are coupled between a positive supply voltage Vhigh (for example generated as in FIG. 11, but not limited thereto) and ground. Pulse generating generation unit 36 generates pulses. It should be noted that this coupling as shown in in FIG. 12A may also be used in the embodiments of FIGS. 3 to 10. In other embodiments, pulse generating unit 36 may be coupled between the switches and Vhigh, or may be coupled as shown in FIGS. 3 to 10 to output both Vhigh and a lower voltage like ground.

In FIG. 12A, switches 34A and 35B are closed, and switches 35A and 34B are open. This leads to a current flow from Vhigh to ground through heater 33 as indicated by an arrow.

Figure 12B:
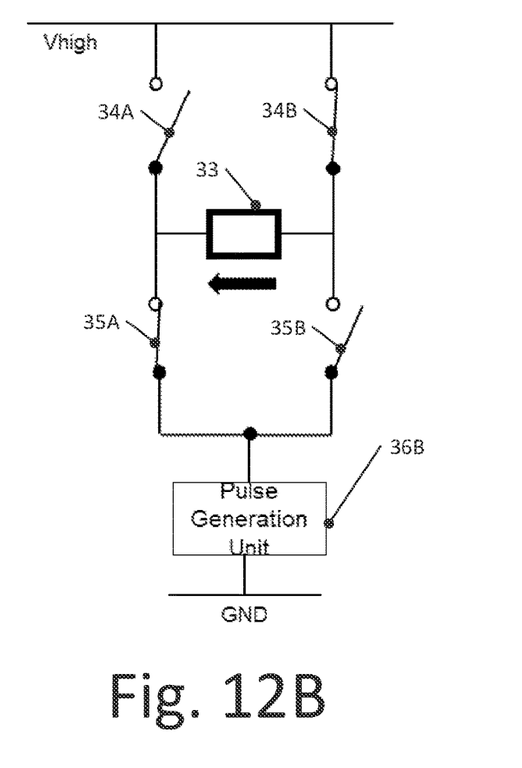

In case of FIG. 12B, switches 34B and 35A are closed, and switches 34A and 35B are open. This leads to a current through heater 33 in the opposite direction compared to FIG. 12A.

Therefore, by providing essentially a "H-configuration" of switches to a heater, current flow in both directions through the heater is enabled. In embodiments, then for example the current direction may be changed every n set/reset cycles, where n is one or more.

As shown in FIGS. 3 to 8, in case of more than one heater, the "H-configurations" of adjacent heater may "share" switches. For example, in FIG. 3 switches 34B, 35B are shared by heaters 33A, 33B in this sense. Also in this case, the switches may be operated to selectively provide current in a first direction or in a second direction opposite the first direction through the heaters, as already briefly explained with respect to FIG. 3. In other embodiments, separate "H-configurations" may be provided for separate heaters. An example is shown in FIG. 13, which is essentially a duplicate of the circuit of FIGS. 12A and 12B. In the example of FIG. 13, also separate pulse generation units 36A, 36B are provided for the two heaters 33A, 33B, and separate switches are provided for the heater (switches 34A, 34B, 35A and 35B for heater 33A and switches 34C, 34D, 35C and 35D for heater 33B). In other embodiments, an AC current could be used for heating where the current direction reverses inherently, but this may be difficult to implement for short cycles.

Some embodiments are defined by the following examples:

Example 1. A phase change switch device, comprising: a phase change material, a set of heaters arranged to heat the phase change material, a power source, and a switch arrangement including a plurality of switches and configured to selectively provide electrical power from the power source to the set of heaters.

Example 2. The phase change switch device of example 1, wherein the switch arrangement is configured for at least one of:
  selectively providing a current either in a first direction through at least one heater of the set of heaters or in a second direction through the at least one heater of the set of heaters, or
  forming a pulse of electrical power through at least one heater of the set of heaters.

Example 3. The phase change switch device of example 1 or 2, wherein the at least one heater comprises a plurality of heaters, wherein the switch arrangement is configured for at least one of:
  supplying the plurality of heaters sequentially with electrical power from the power source,
  selectively supplying the plurality of heaters sequentially or simultaneously with electrical power from the power source.

Example 4. The device of any one of examples 1 to 3, wherein the power source is a single power source.

Example 5. The device of any one of example 1 to 4, wherein the power source comprises a pulse generator.

Example 6. The phase change switch device of any one of examples 1 to 5, wherein for at least one heater of the set of heaters, the plurality of switches includes a first switch between a first terminal of the at least one heater and a first terminal of the power source, and a second switch between the first terminal of the at least one heater and a second terminal of the power source.

Example 7. The phase change switch device of example 6, wherein for the at least one heater the plurality of switches includes a third switch between a second terminal of the at least one heater and a first terminal of the power source, and a fourth switch between the second terminal of the at least one heater and a second terminal of the power source.

Example 8. The phase change switch device of example 7, wherein the at least one heater includes a plurality of heaters of the set of heaters coupled in series, wherein the third and fourth switches of one heater of the plurality of heaters correspond to the first and second switches of a next heater following the one heater in the series coupling.

Example 9. The phase change switch device of any one of examples 1 to 6, wherein the set of heaters includes a plurality of heaters coupled in series, wherein the plurality of switches include switches alternatingly coupled between nodes between adjacent heaters in the series coupling and either a first terminal of the power source or a second terminal of the power source.

Example 10. The phase change switch device of any one of examples 1 to 5, wherein the set of heaters includes a plurality of heaters, wherein for each of the plurality of heaters the plurality of switches includes a respective switch coupled between a first terminal of the respective heater and a first terminal of the power source, wherein second terminal of the plurality of heaters are coupled to a second terminal of the power source.

Example 11. The phase change switch device of any one of examples 1 to 10, wherein the phase change material and the plurality of heaters are configured to form one of a single pole single throw switch device between an input terminal and an output terminal or a single pole multi throw switch device between an input terminal and a plurality of output terminals.

Example 12. A method of operating the phase change switch device of any one of examples 1 to 11, comprising:
  operating the plurality of switches of the switch arrangement for at least one of:
    selectively providing a current either in a first direction through at least one heater of the set of heaters or in a second direction through the at least one heater of the set of heaters, or
    forming a pulse of electrical power through at least one heater of the set of heaters.

Example 13. A method of operating the phase change switch device of any one of examples 1 to 11, wherein the set of heaters comprises a plurality of heaters, comprising:
  operating the plurality of switches of the switch arrangement for at least one of:
    supplying the plurality of heaters sequentially with electrical power from the power source,
    selectively supplying the plurality of heaters sequentially or simultaneously with electrical power from the power source.

Example 14. The method of example 13, wherein operating the plurality of switches of the switch arrangement for selectively supplying the plurality of heaters sequentially or in parallel with electrical power from the power source comprises operating the plurality of switches for sequentially supplying the plurality of heaters to change the phase change material to an amorphous state, and operating the plurality of switches for supplying the plurality of heaters in parallel to change the phase change material to a crystalline state.

Example 15. A controller for operating the plurality of switches of the phase change switch device of any one of examples 1 to 12, wherein the controller is configured to operate the switches to perform the method of any one of examples 12 to 14.

Example 16. A system, comprising the phase change switch device of any one of examples 1 to 12 and the controller of example 15.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase change switch device, comprising:
   a phase change material;
   a set of heaters arranged to heat the phase change material;
   a power source; and
   a switch arrangement including a plurality of switches and configured to selectively provide electrical power from the power source to the set of heaters,
   wherein the switch arrangement is configured for selectively providing a current either in a first direction through at least one heater of the set of heaters or in a second direction through the at least one heater of the set of heaters.

2. The phase change switch device of claim 1, wherein the switch arrangement is configured for forming a pulse of electrical power through at least one heater of the set of heaters.

3. The phase change switch device of claim 1, wherein the at least one heater comprises a plurality of heaters, and wherein the switch arrangement is configured for supplying the plurality of heaters sequentially with electrical power from the power source.

4. The phase change switch device of claim 1, wherein the at least one heater comprises a plurality of heaters, and wherein the switch arrangement is configured for selectively supplying the plurality of heaters sequentially or simultaneously with electrical power from the power source.

5. The phase change switch device of claim 1, wherein the power source is a single power source.

6. The phase change switch device of claim 1, wherein for at least one heater of the set of heaters, the plurality of switches includes a first switch between a first terminal of the at least one heater of the set of heaters and a first terminal of the power source, and a second switch between the first terminal of the at least one heater of the set of heaters and a second terminal of the power source.

7. The phase change switch device of claim 6, wherein for the at least one heater of the set of heaters, the plurality of switches includes a third switch between a second terminal of the at least one heater of the set of heaters and the first terminal of the power source, and a fourth switch between the second terminal of the at least one heater of the set of heaters and the second terminal of the power source.

8. The phase change switch device of claim 7, wherein the at least one heater of the set of heaters includes a plurality of heaters of the set of heaters coupled in series, and wherein the third and fourth switches of one heater of the plurality of heaters correspond to the first and second switches of a next heater following the one heater in the series coupling.

9. The phase change switch device of claim 1, wherein the set of heaters includes a plurality of heaters coupled in series, and wherein the plurality of switches includes switches alternatingly coupled between nodes between adjacent heaters in the series coupling and either a first terminal of the power source or a second terminal of the power source.

10. The phase change switch device of claim 1, wherein the set of heaters includes a plurality of heaters, wherein for each heater of the plurality of heaters, the plurality of switches includes a respective switch coupled between a first terminal of the respective heater and a first terminal of the power source, and wherein a second terminal of each heater of the plurality of heaters is coupled to a second terminal of the power source.

11. The phase change switch device of claim 1, wherein the phase change material and the plurality of heaters are configured to form one of a single pole single throw switch device between an input terminal and an output terminal or a single pole multi throw switch device between the input terminal and a plurality of output terminals.

12. A phase change switch device, comprising:
    a phase change material;
    a set of heaters arranged to heat the phase change material;
    a power source; and
    a switch arrangement including a plurality of switches and configured to selectively provide electrical power from the power source to the set of heaters,
    wherein the at least one heater comprises a plurality of heaters,
    wherein the switch arrangement is configured for supplying the plurality of heaters sequentially with electrical power from the power source.

13. A phase change switch device, comprising:
    a phase change material;
    a set of heaters arranged to heat the phase change material;
    a power source; and
    a switch arrangement including a plurality of switches and configured to selectively provide electrical power from the power source to the set of heaters,
    wherein for at least one heater of the set of heaters, the plurality of switches includes a first switch between a first terminal of the at least one heater of the set of heaters and a first terminal of the power source, and a second switch between the first terminal of the at least one heater of the set of heaters and a second terminal of the power source.

14. The phase change switch device of claim 13, wherein for the at least one heater of the set of heaters, the plurality of switches includes a third switch between a second terminal of the at least one heater of the set of heaters and the first terminal of the power source, and a fourth switch between the second terminal of the at least one heater of the set of heaters and the second terminal of the power source.

15. The phase change switch device of claim 14, wherein the at least one heater of the set of heaters includes a plurality of heaters of the set of heaters coupled in series, and wherein the third and fourth switches of one heater of the plurality of heaters correspond to the first and second switches of a next heater following the one heater in the series coupling.

16. A phase change switch device, comprising:
a phase change material;
a set of heaters arranged to heat the phase change material;
a power source; and
a switch arrangement including a plurality of switches and configured to selectively provide electrical power from the power source to the set of heaters,
wherein the set of heaters includes a plurality of heaters coupled in series,
wherein the plurality of switches includes switches alternatingly coupled between nodes between adjacent heaters in the series coupling and either a first terminal of the power source or a second terminal of the power source.

* * * * *